United States Patent [19]
Wong

[11] Patent Number: 5,202,840
[45] Date of Patent: Apr. 13, 1993

[54] METHOD FOR PARTITIONING OF CONNECTED CIRCUIT COMPONENTS BEFORE PLACEMENT IN ONE OR MORE INTEGRATED CIRCUITS

[75] Inventor: Dale M. Wong, San Francisco, Calif.

[73] Assignee: VLSI Technology, Inc., San Jose, Calif.

[21] Appl. No.: 630,284

[22] Filed: Dec. 19, 1990

[51] Int. Cl.$^5$ .............................................. G06F 15/60
[52] U.S. Cl. ................................... 364/490; 364/489; 364/488
[58] Field of Search ................ 364/488, 489, 490, 491

[56] References Cited

U.S. PATENT DOCUMENTS

| | | | |
|---|---|---|---|
| T944,001 | 3/1976 | Hanan et al. | 364/490 |
| 4,495,559 | 1/1985 | Gelatt, Jr. et al. | 364/491 |
| 4,593,363 | 6/1986 | Burstein et al. | 364/491 |
| 4,815,003 | 3/1989 | Putatunda et al. | 364/491 |
| 4,890,238 | 12/1989 | Klein et al. | 364/491 |
| 4,908,772 | 3/1990 | Chi | 364/491 |

OTHER PUBLICATIONS

"Partitioning and Placement Technique for CMOS Gate Arrays" by G. Odawara et al; IEEE Trans. on Computer-Aided Design, vol. CAD-6, No. 3, May 1987, pp. 355-363.

"An Efficient Heuristic Procedure for Partitioning Graphs" by Kermghan et al; The Bell System Technical Journal, Feb. 1970, pp. 291-307.

"A Linear-Time Heuristic for Improviding Network Partitions" by Fiducco et al; IEEE 19th Design Automation Conf., 1982, pp. 175-181.

*Primary Examiner*—Vincent N. Trans
*Attorney, Agent, or Firm*—Douglas L. Weller

[57] ABSTRACT

In a method for partitioning components of an integrated circuit into clusters in preparation for placement of the clusters onto an integrated circuit, a connectivity cost is assigned to every pair of connected components. Then, beginning with a pair of connected components with a lowest assigned connectivity cost and proceeding to a pair of connected components with a highest assigned connectivity cost, the components are placed in a cluster tree so that when merging cluster tree nodes, a cluster tree node with a higher connectivity cost is made a parent cluster tree node of a cluster tree node with a lower connectivity cost. The cluster tree may then traversed to partition the components into clusters. The clusters can be optimized by moving individual components to clusters when such a move results in a lower incremental connectivity cost. Once the components have been partitioned into clusters, the clusters of components may be placed on an integrated circuit.

18 Claims, 6 Drawing Sheets

METHOD FOR PARTITIONING OF CONNECTED CIRCUIT COMPONENTS BEFORE PLACEMENT IN ONE OR MORE INTEGRATED CIRCUITS

BACKGROUND

The present invention concerns optimal partitioning of circuit components into an unspecified number of clusters such that the number of inter-cluster connections is minimal.

In the design of integrated circuits, circuitry consists of functional blocks of logic often called components, which are interconnected by connection lines. When laying out the circuitry on one or more integrated circuits it is often desirable to cluster the components together. When clustering the components it is important to minimize the interconnections between clusters. This is because interconnections between components require the placement of connection lines. Connection lines have a measurable width and take up space on the integrated circuit which is directly proportional to their length. On a single integrated circuit, interconnections between clusters generally require connections lines which are on average longer than connection lines which are used for connections within clusters. Therefore, minimizing the interconnections between clusters reduces the amount of surface area of an integrated circuit required by the circuitry.

In the prior art, the clustering of components has generally been done using one of two methods. The first method includes the use of repetitive bi-partitioning. For further explanation of this method, see for example B.W. Kernighan and S. Lin; *An Efficient Heuristic Procedure for Partitioning Graphs*; Bell System Technical Journal; 49(2):291-307; February 1970. The second method includes the cluster growth around seed components. For further explanation of this method, see for example H. Cho, G. Hachtel, M. Nach, and L. Setiono; *BEAT NP: A tool for Partitioning Boolean Networks*; Proceedings of the ICCAD, pp. 10-13; November 1988.

The above-discussed prior art methods depend on arbitrary decisions. For example, in the first method which uses repetitive bi-partitioning, arbitrary decisions are made about the size of the partitions, e.g., typically the partitions are assumed to be of equal size. In the second method which uses cluster growth around seed components, arbitrary decisions are made about the choice of seed components. In either case, different choices can lead to completely different results. It is desirable, therefore, to employ a method which does not rely on arbitrary decisions to arrive at an optimal partitioning of circuit components into clusters.

SUMMARY OF THE INVENTION

In accordance with the preferred embodiment of the present invention, a method is presented for partitioning components of an integrated circuit into clusters in preparation for placement of the clusters onto an integrated circuit.

First, a connectivity cost is assigned to every pair of connected components. What is meant by a pair of connected components are two components that are directly connected through a connection line. The connectivity cost inversely measures the relative "connectedness" between a pair of components. When a pair of components is tightly connected—i.e., there are a relatively large number of connections between the two components—the connectivity cost between the two components is low. When a pair of components is loosely connected—i.e., there are relatively few connections between the two components—the connectivity cost between the two components is high. The connectivity cost between a pair of components may be calculated in a number of ways. For example, the following Formula 1 may be used:

FORMULA 1

$$\text{cost} = (\text{total\_connections} - \text{total\_interconnections}) / \text{total\_connections}$$

In the above Formula 1, total_connections is the total number of connections which are connected to either of the pair of components. Total_interconnections is the total number of connections between the pair of components.

Second, beginning with a pair of connected components with a lowest assigned connectivity cost and proceeding to a pair of connected components with a highest assigned connectivity cost, the components are placed in a cluster tree. As the cluster tree is built, cluster tree nodes with higher connectivity costs are chosen to be the parent cluster tree nodes of cluster tree nodes with lower connectivity costs. This is done by first sorting the pairs of connected components based on the connectivity cost associated with each pair. For example, a heap sort algorithm may be used for the sorting. Then each pair of connected components beginning with the pair of connected components with the lowest assigned connectivity cost and proceeding to the pair of connected components with the highest assigned connectivity cost is considered.

If both components in the pair of connected components are in a same class of connected components, the pair is discarded. A class is all the components that have been merged into a single cluster tree node.

If both components in the pair of connected components are separate classes of connected components, it is determined which of the two classes has a higher connectivity cost. This may be done in a number of ways. For example, the connectivity cost of a class may be calculated by summing the connectivity costs for all component pairs in the class. Alternately, the connectivity cost of a class may be the maximum of the connectivity cost assigned to a pair of connected components in the class. Another way of calculating the connectivity cost would be to apply Formula 1 to the whole class. In this case total_connections is equal to the total number of connections which are connected to at least one component in the class. Total_interconnections is the total number of connections which are connected to at least two components within the class. If both classes have the same connectivity cost, one class is arbitrarily chosen to be the class with the lower connectivity cost.

The class with the lower connectivity cost is merged into the class with the higher connectivity cost to form a parent cluster tree node. The class with the lower connectivity cost is made a child cluster tree node of the parent cluster tree node.

Third, the cluster tree is traversed to partition the components into clusters. The partitioning may be done using a variety of criterion. For example, the criterion may be based on the size of a cluster, the maximum number of external connections from each cluster, or resulting packaging cost.

Fourth, the clusters may be optimized by moving individual components to clusters when such a move results in a lower incremental connectivity cost. The incremental connectivity cost for a first component in a first cluster may be calculated by subtracting the connectivity cost of the first cluster without the first component from the connectivity cost of the first cluster including the first component. If a component is not residing in the partition with the lowest incremental connectivity cost, the component is moved to the partition with the lowest incremental connectivity cost. Once every component has been considered, the optimization process may be repeated as many time as necessary until the optimum placement of every component has been reached.

Once the components have been partitioned into clusters, the clusters of components may be placed on an integrated circuit.

DESCRIPTION OF THE PREFERRED EMBODIMENT

Figure 1A:
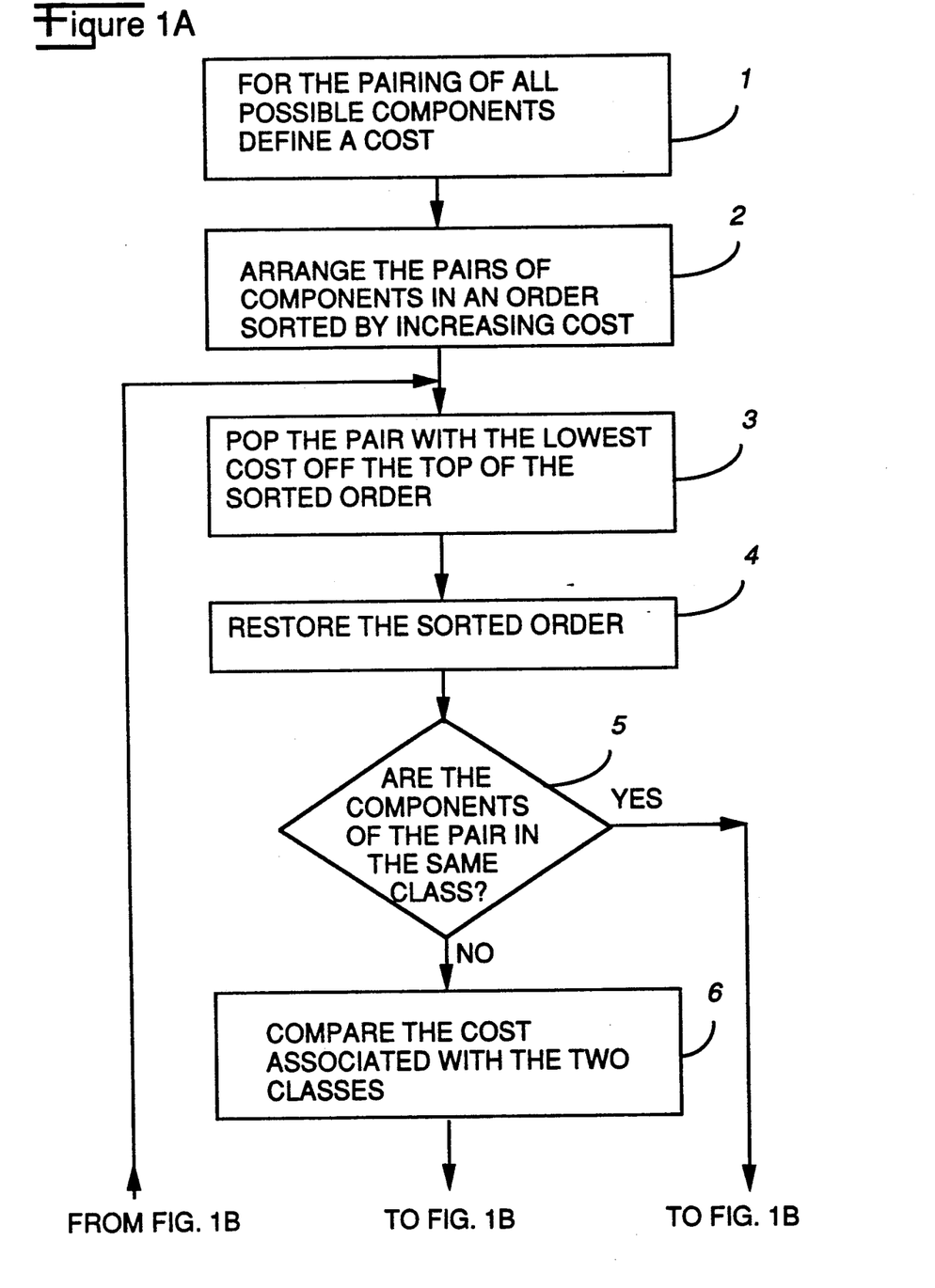
FIGS. 1A and 1B show a flowchart which describe a method of partitioning circuit components before placement of the circuit components on one or more integrated circuits in accordance with the preferred embodiment of the present invention.
Figure 1B:
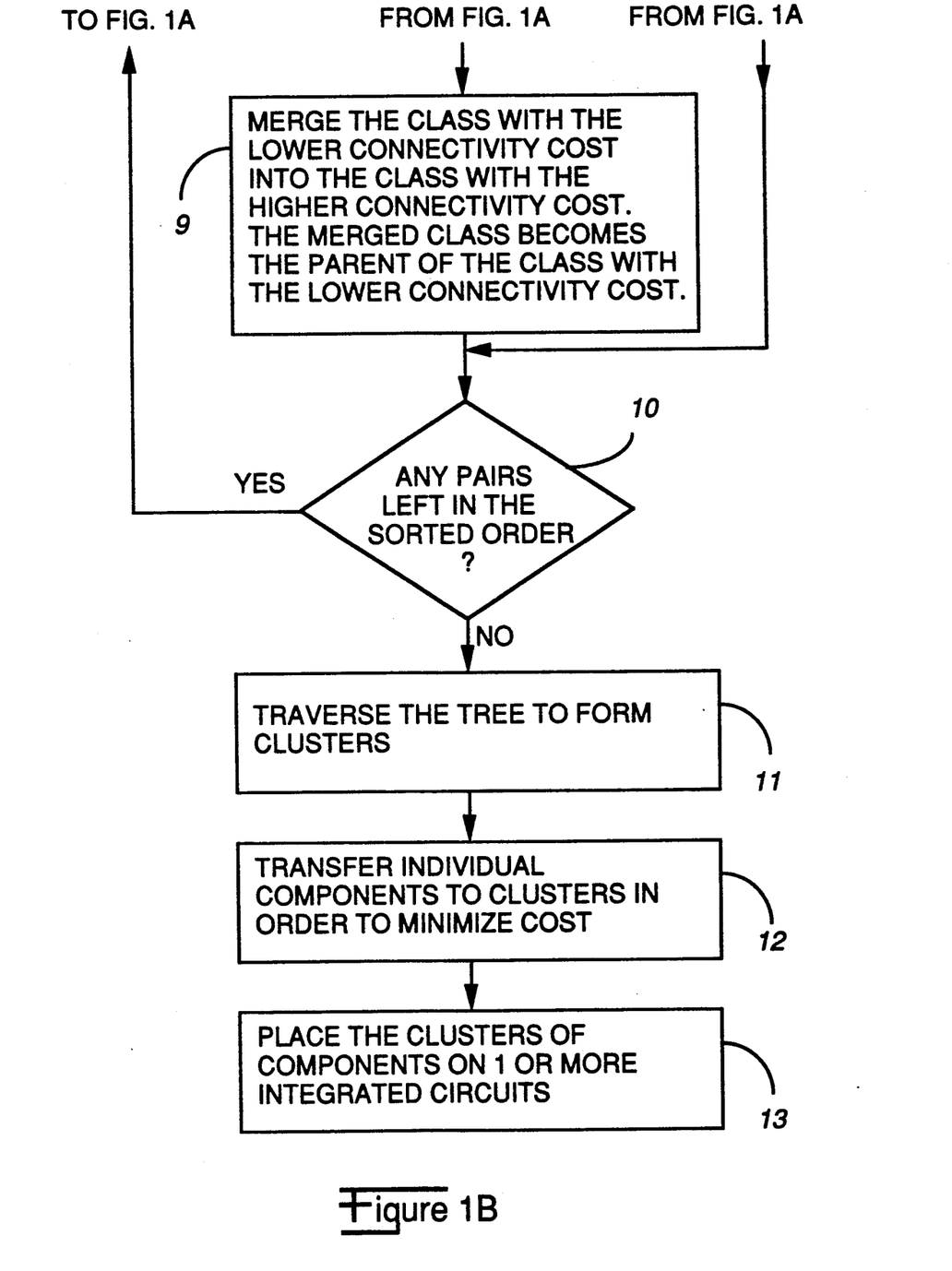

The present invention allows circuit components to be partitioned into clusters without any arbitrary constraints on the number or size of the clusters. FIGS. 1A and 1B include a flowchart which describe the method.

In a step 1, a connectivity cost is defined for each possible pairing of connected components. What is meant by a possible pairing of connected components are two components that are directly connected through a connection line. These pairings of connected components are also referred to herein as component pairs.

Figure 2A:
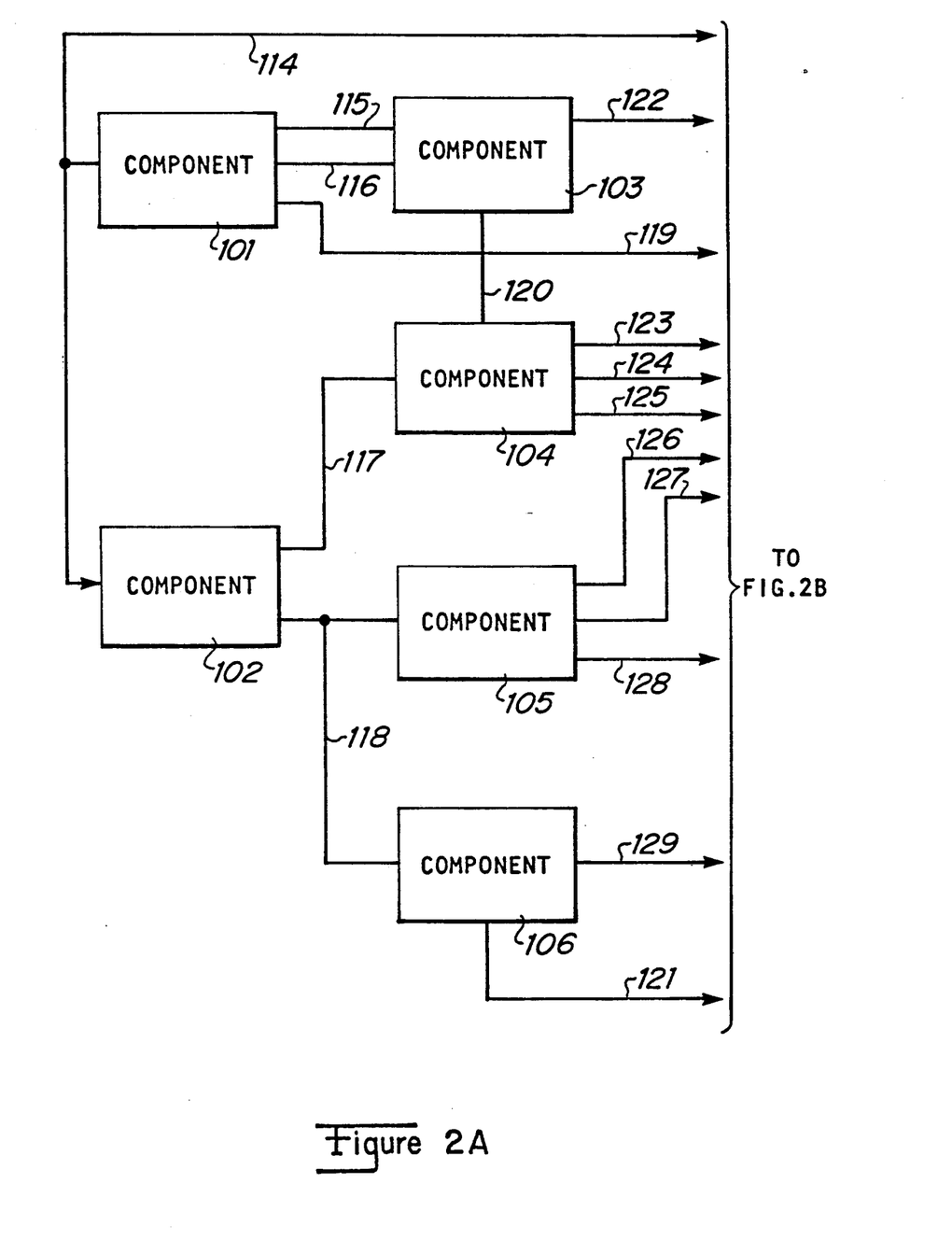
FIGS. 2A and 2B show simplified block diagrams of interconnected components.
Figure 2B:
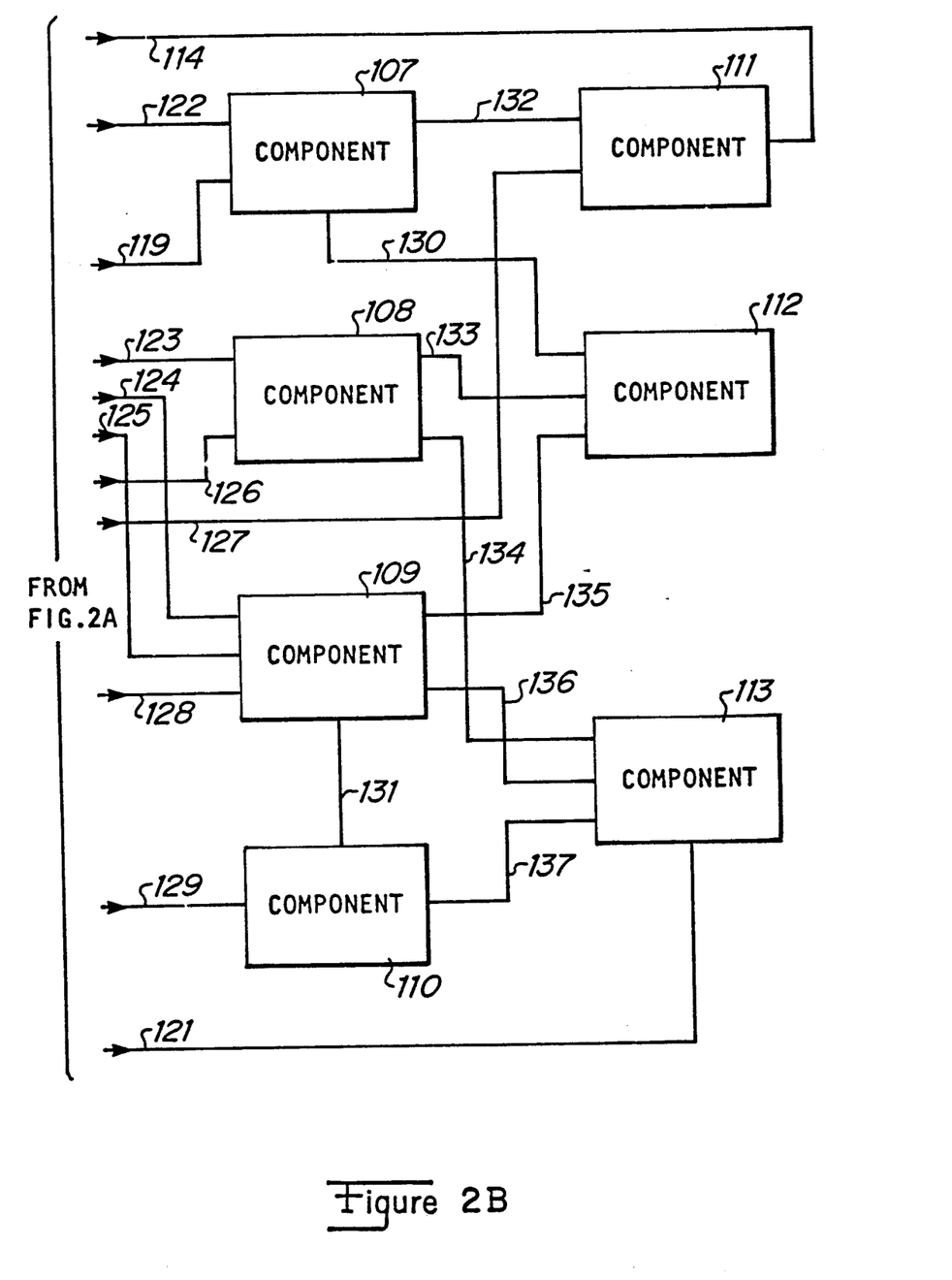

This is illustrated by FIG. 2. FIG. 2 is an extremely simplified block diagram of interconnected components. Typically, the design of an integrated circuit may include many thousands of components with many thousands of connection lines between the components. In FIG. 2, components 101 through 113 are connected together through connection lines 114 through 137. Possible pairings of connected components are those pairs of components connected by a connection line. For example, a connection line 122 extends between component 103 and component 107. Therefore, components 103 and 107 are a possible pairing of connected components. Similarly a connection line 124 and a connection line 125 extend between components 104 and 109. Therefore components 104 and 109 are connected components. However, there is no connection line between component 113 and component 101. Neither is there any connection line between component 104 and component 105. Therefore, these are not possible pairings of connected components.

Once each possible pairing is identified, a connectivity cost is assigned each pairing. In general, the connectivity cost should be low for components connected by a large number of connection lines, and the connectivity cost should be high for components connected by only a small number of connection lines. One example of a function which assigns a connectivity cost to a pairing of components according to the above criteria is defined by Formula 1, set out below.:

FORMULA 1 cost = (total_connections − total_interconnections)/total_connections In this use of formula 1, total_connections is the total number of connection lines connected to either of the components of the pair. Total_interconnections is the total number of connections line connected between the components of the pair.

Again FIG. 2 may be used for illustration. The above formula 1 may be used to calculate the connectivity cost for the pairing of component 104 and component 109. The connection lines which are connected to either of component 104 or component 109 are connection lines 117, 120, 123, 124, 125, 128, 131, 135 and 136 for a total of 9. The connection lines which are interconnected between component 104 and 109 are connection lines 124 and 125 for a total of 2. The connectivity cost for the component pair of components 104 and 109 may therefore be calculated using the above formula 1 as follows:

$$\text{connectivity cost} = (9 - 2)/9$$
$$= 7/9$$

Once a connectivity cost is defined for all possible pairings of connected components, in a step 2, the pairs of components are arranged so that the pair of components with the lowest connectivity cost may be easily accessed. This could be done by a number of sorting algorithms. One simple algorithm, for example, would be a bubble sort which would entail the initial arbitrary ordering of a list of all connected pairs of components. Several passes would be made through this initial ordering of pairs in which the connectivity cost of adjacent pairs is compared. If a connectivity cost of a pair lower on the list is lower than a connectivity cost of a pair high on the list, the position of the two pairs on the list are interchanged. When a complete pass is made without any pairs being interchanged, the sort is complete.

In the preferred embodiment of step 2, the sorted order is created using a heap sort algorithm to arrange all possible pairing of components in a heap ordered by increasing connectivity cost. A heap is a binary tree in which the weight of ever cluster tree node is smaller than or equal to the weights of its children. The heap sort algorithm is utilized in the preferred embodiment because at any point in time it is not necessary to know a complete ordering of the pairs of components, but only a remaining pair of components with the lowest connectivity cost. A heap sorting algorithm is an "n(log(n))" sorting algorithm which meets this requirement. For a general discussion of a heap and a heap sorting algorithm see Sara Baase; *Computer Algorithms: Introduction to Design and Analysis*: Addison-Wesley Publishing Company; Massachusetts; 1978; pp. 66–73.

Once a heap has been formed, component pairs are removed from the top of the heap and placed in a cluster tree. This is done as follows. In a step 3, the component pair with the lowest connectivity cost is taken from the top of the heap. In a step 4, the heap is restored so that a remaining component pair with the lowest connectivity cost is at the top of the heap.

In a step 5, a check is made to see if each of the components from the pair of components which was removed from the top are currently in the same class. A class consists of all components which have been merged together into a root cluster tree node.

If, in step 5, the components of the pair are already in the same class, the component pair is discarded and a jump is made to a step 10. If the components of the pair of components are not in the same class, in a step 6, a comparison is made of the connectivity cost associated with each class. The connectivity for a class may be calculated in a number of ways. For example, the connectivity cost of a class may be calculated by summing the connectivity costs for all component pairs in the class. Alternately, the connectivity cost of a class may be the maximum of the connectivity cost assigned to a pair of connected components in the class. Another way of calculating the connectivity cost would be to apply Formula 1 to the whole class. In this case total_connections is equal to the total number of connections which are connected to at least one component in the class. Total_interconnections is the total number of connections which are connected to at least two components within the class. If both classes have the same connectivity cost, one class is arbitrarily chosen to be the class with the lower connectivity cost.

In a step 9, the class with the lower connectivity cost is merged into the class with the higher connectivity cost. The merged class becomes the parent cluster tree node. The class with the lower connectivity cost is the child cluster tree node of the merged class. The parent cluster tree node becomes the root cluster tree node for the merged class.

For the first few component pairs popped off the heap, each of the components may initially not be in any class. The pair of components are merged to form a root cluster tree node of a new class. The connectivity cost of the new class is the connectivity cost of the component pair forming the new class. If a first component of the pair is in a class and the second component in the pair does not belong to any class, the second component is treated as being in a class consisting of only the second component, and as having a connectivity cost of zero. The second component cluster tree node is merged to the root cluster tree node of the class of the first component. The second component in the pair is also made a child cluster tree node of the merged class.

Once the two classes have been merged into a cluster tree node in the cluster tree, in a step 10, a check is made to determine whether any component pairs remain in the heap. If there are component pairs remaining in the heap, step 3 is returned to and a pair still in the heap with the lowest connectivity cost is popped off and evaluated.

If there are no pairs left in the heap, then the cluster tree has been completely built. The actual programming code used to build a cluster tree as described above is similar to the code used to construct a minimum spanning tree using Kruskal's algorithm. For a further description of Kruskal's algorithm and sample implementation code, see M.M. Syslo, N. Deo, J.S. Kowalik; *Discrete Optimization Algorithms*; Prentice-Hall; 1983; pp. 253–259.

FIGS. 3 through 8 give a simplified illustration of the building of a cluster tree. Table 1 below gives a list of component pairs to be placed in the cluster tree and a connectivity cost assigned to each component pair.

TABLE 1

| Component pair | Connectivity Cost |
|---|---|
| a,b | .2 |

TABLE 1-continued

| Component pair | Connectivity Cost |
|---|---|
| c,d | .3 |
| a,e | .3 |
| f,g | .4 |
| b,e | .5 |
| c,i | .5 |
| g,h | .7 |
| c,e | .8 |
| b,f | .8 |
| d,i | .9 |
| a,h | .9 |

Figure 3:
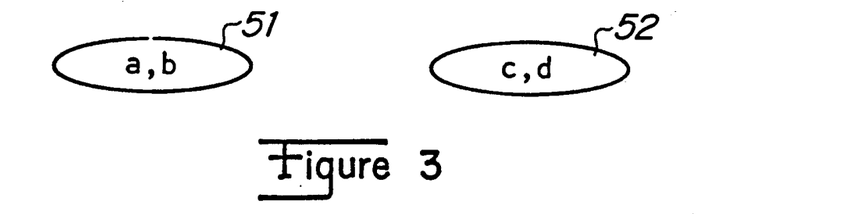
FIGS. 3 through 8 illustrate the building of a cluster tree.
Figure 4:
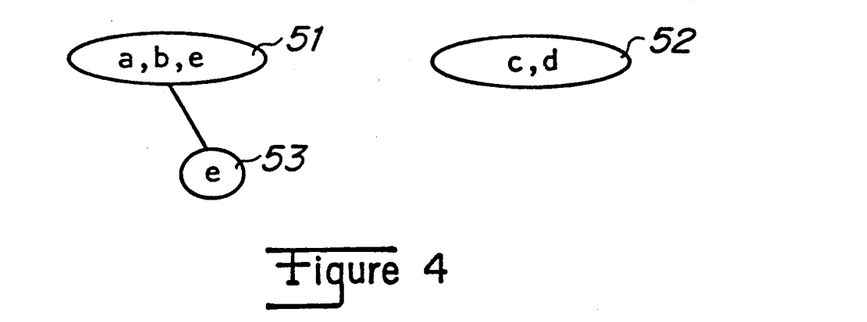

The first component pair [a,b] is popped off the sorted order and used to form a cluster tree node 51, shown in FIG. 3. The second component pair [c,d] is popped off the sorted order and used to form a cluster tree node 52 shown in FIG. 3. The third component pair [a,e] is popped off the sorted order. Component a is part of the class {a,b} consisting of components in cluster tree node 51. The connectivity cost (0) of the class consisting of component {e} is lower than the connectivity cost (0.2) of the class {a,b}. Therefore, as shown in FIG. 4, component e is merged into cluster tree node 51. Component e is also placed as a child cluster tree node 53 of cluster tree node 51.

Figure 5:
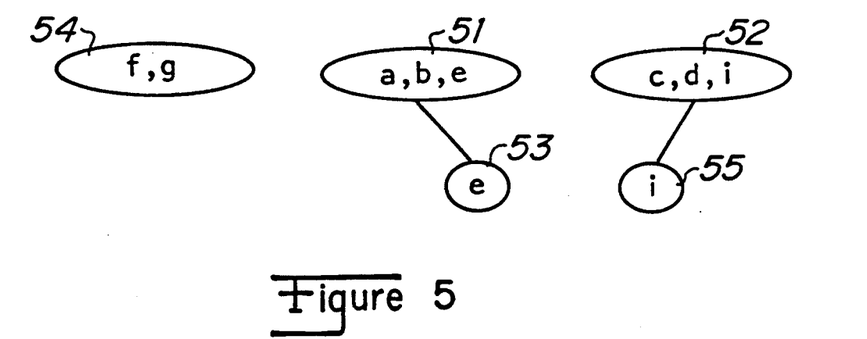

The fourth component pair [f,g] is popped off the sorted order and used to form a cluster tree node 54 shown in FIG. 5. The fifth component pair [b,e] are popped off the sorted order. However, component b and component e are already in the same class, as they both reside in cluster tree node 51. Therefore, this component pair is discarded.

The sixth component pair [c,i] is popped off the sorted order. Component c is part of the class {c,d} consisting of components in cluster tree node 52. The connectivity cost (0) of the class consisting of component {i} is lower than the connectivity cost (0.3) of the class {c,d}. Therefore, as shown in FIG. 5, component i is merged into cluster tree node 52. Component e is also placed as a child cluster tree node 55 of cluster tree node 52.

Figure 6:
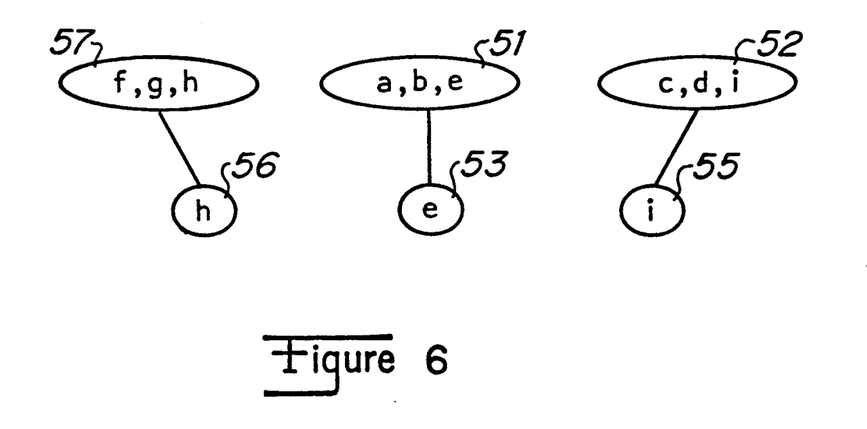

The seventh component pair [g,h] is popped off the sorted order. Component g is part of the class {f,g} consisting of components in cluster tree node 54. The connectivity cost (0) of the class consisting of component {h} is lower than the connectivity cost (0.4) of the class {f,g}. Therefore, as shown in FIG. 6, component h is merged into class 54. Component e is also placed as a child cluster tree node 56 of cluster tree node 54.

Figure 7:
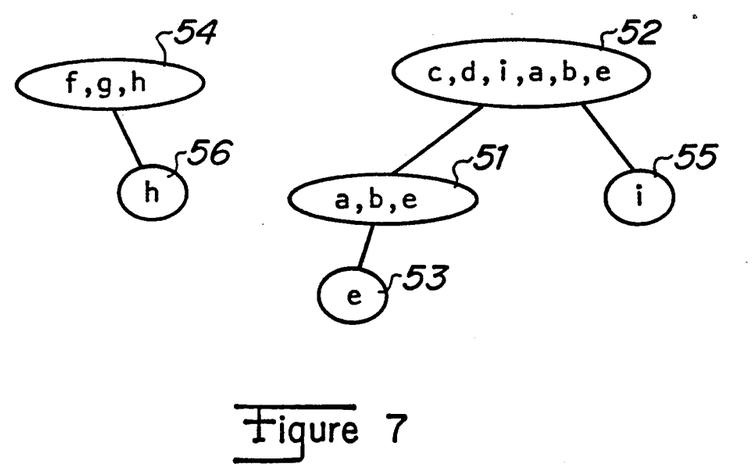

The eighth component pair [c,e] is popped off the sorted order. Component c is part of the class {c,d,i} consisting of components in cluster tree node 52. Component e is part of the class {a,b,e} consisting of components in cluster tree node 51. The connectivity cost of class {c,d,i} is equal to the sum of the connectivity cost of component pairs [c,d] and [c,i] which is 0.8 (i.e., 0.3 plus 0.5). The connectivity cost of class {a,b,e} is equal to the sum of the connectivity cost of component pairs [a,b] and [a,e] which is 0.5 (i.e., 0.2 plus 0.3). The connectivity cost of class {a,b,e} is lower than the connectivity cost of class {c,d,i}. Therefore, as shown in FIG. 7, components a, b and e are added to cluster tree node 52. Cluster tree node 51 becomes a child cluster tree node of cluster tree node 52.

Figure 8:
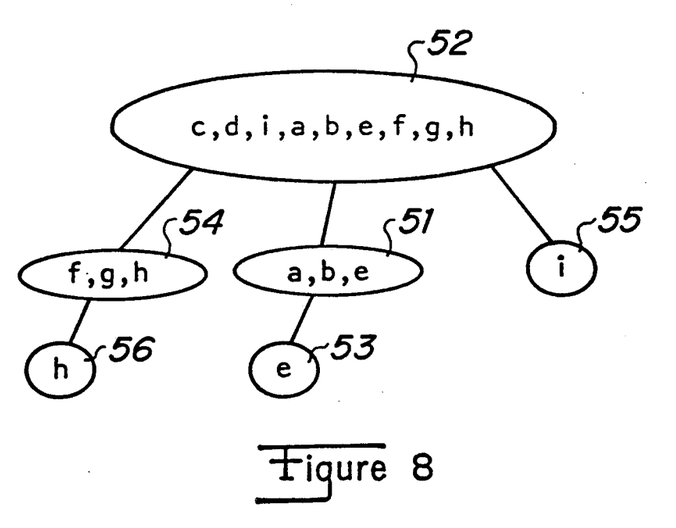

The ninth component pair [b,f] is popped off the sorted order. Component b is part of the class {c,d,i,a,b,e} consisting of components in cluster tree node 52.

Component f is part of the class {f,g,h} consisting of components in cluster tree node 54. The connectivity cost of class {c,d,i,a,b,e} is equal to the sum of the connectivity cost of component pairs [c,d], [c,i] [a,b] and [a,e] which is 1.3. The connectivity cost of class {f,g,h} is equal to the sum of the connectivity cost of component pairs [f,g] and [g,h] which is 1.1 (i.e., 0.4 plus 0.7). The connectivity cost of class {f,g,h} is lower than the connectivity cost of class {c,d,i.a,b,e}. Therefore, as shown in FIG. 8, components f, g and h are added to cluster tree node 52. Cluster tree node 54 becomes a child cluster tree node of cluster tree node 52.

The tenth component pair [d,i] is popped off the sorted order. However, component d and component i are already in the same class, as they both reside in cluster tree node 52. Therefore, this component pair is discarded. The eleventh component pair [a,h] is popped off the sorted order. However, component a and component h are already in the same class, as they both reside in cluster tree node 52. Therefore, this component pair is discarded.

Once the cluster tree has been built, in a step 11, the cluster tree is traversed to partition the components into clusters. This is done by traversing the cluster tree top down while applying once or more constraints to the potential clusters. If the components of a cluster tree node pass the test, a single cluster is formed of the components in the cluster tree node. There is a variety of constraints which may be used. For example, the constraints could be based on the estimated or actual amount of space the components in the cluster tree node and its progeny would utilize if placed on an integrated circuit. Besides a test for maximum size, other constraints could include maximum number of external connections of any cluster, the total number of clusters, or the assigning of components to separate packages in a way that minimizes the packaging cost. Further, the test criteria could be varied and the cluster tree traversed many times to form different partitions. One of the advantages of the present invention is that such different partitions could be obtained by traversing the same cluster tree but using a different test criteria. This allows the evaluation of several different partitions without taking u the processing time required to build a new cluster tree.

For example, in the cluster tree shown in FIG. 8, when traversing the cluster tree, the first level of clustering is cluster tree node 52 consisting of the class {c,d,i,a,b,e,f,g,h}. Traversal to the next lower clustering level yields clusters {f,g,h}, {a,b,e}, {i} and {c,d}. Traversal to the lowest clustering level yields the clusters {h}, {f,g}, {e}, {a,b}, {i} and {c,d}.

Once the components have been partitioned into clusters, in a step 12, the partitioning may be optimized. This can be done by, in turn, evaluating the optimal partitioning for each component. To do this the incremental connectivity cost of adding the component to each partition is evaluated. This incremental connectivity cost may be calculated by subtracting the connectivity cost of all components in the cluster without the component from the connectivity cost of the cluster including the component. If the component is not residing in the partition with the lowest incremental connectivity cost, the component is moved to the partition with the lowest incremental connectivity cost. The optimization process may be repeated until the optimum placement of every component has been reached. In order to calculate connectivity cost for a partition, formula 1 above may be used. In this case total__connections is the total number of connections which are connected to any component in the class. Total__interconnections is the total number of connections between any components in the class.

Once the optimum partitioning has been reached, in a step 13, the clusters of components may be placed on an integrated circuit.

We claim:

1. A computer implemented method for partitioning components of an integrated circuit into clusters in preparation for placement of the clusters onto an integrated circuit, the method implemented by a computer and comprising the steps of:
    (a) assigning, by the computer, a connectivity cost to every pair of connected components;
    (b) beginning with a pair of connected components with a lowest assigned connectivity cost and proceeding to a pair of connected components with a highest assigned connectivity cost, placing, by the computer, the components in a cluster tree so that when merging cluster tree nodes, a cluster tree node with a higher connectivity cost is made a parent cluster tree node of a cluster tree node with a lower connectivity cost; and,
    (c) traversing, by the computer, the cluster tree to partition the components into clusters.

2. A computer implemented method as in claim 1 wherein the connectivity cost in step (a) is calculated using the formula:

$$\text{cost} = (\text{total\_connections} - \text{total\_interconnections})/\text{total\_connections}.$$

3. A computer implemented method as in claim 1 wherein step (b) includes the following substeps:
    (b.1) sorting the pairs of connected components based on the connectivity cost associated with each pair; and,
    (b.2) for each pair of connected components beginning with the pair of connected components with the lowest assigned connectivity cost and proceeding to the pair of connected components with the highest assigned connectivity cost, if both components in the pair of connected components are not in a same class of connected components, performing the following substep:
    (b.2.1) merging a first class containing a first component of the pair of connected components into a second class containing a second component of the pair of connected components to form a cluster tree node and making the first class a child cluster tree node of the cluster tree node when a connectivity cost of the first class is not greater than a connectivity cost of the second class.

4. A computer implemented method as in claim 3 wherein in substep (b.1) the sorting is done using a heap sort algorithm.

5. A computer implemented method as in claim 3 wherein the connectivity cost in step (a) is calculated using the formula:

$$\text{cost} = (\text{total\_connections} - \text{total\_interconnections})/\text{total\_connections}.$$

6. A computer implemented method as in claim 3 additionally comprising the step of:

(d) optimizing, by the computer, the clusters by moving individual components to clusters when such a move results in a lower incremental connectivity cost.

7. A computer implemented method as in claim 6 additionally comprising the step of:
(e) placing the clusters of components on an integrated circuit.

8. A computer implemented method as in claim 3 wherein in step (c) a criterion used in partitioning components is size of cluster.

9. A computer implemented method as in claim 3 wherein in step (c) a criterion used in partitioning components is a maximum number of external connections from each cluster.

10. A computer implemented method as in claim 3 wherein in step (c) a criterion used in partitioning components is a packaging cost.

11. A computer implemented method as in claim 3 wherein the substep (b.2) the connectivity cost for each class is a maximum of connectivity costs associated with a pair of connected components in the class.

12. A computer implemented method as in claim 3 wherein in substep (b.2) the connectivity cost for each class is calculated by summing connectivity costs for all component pairs in the class.

13. A computer implemented method as in claim 3 wherein in substep (b.2) the connectivity cost for a class is calculated by subtracting a number of connections which are connected to at least two components in the class from a number of connections which are connected to at least one component in the class and dividing a resulting difference by the number of connections which are connected to at least one component in the class.

14. A computer implemented method as in claim 1 additionally comprising the step of:
(d) optimizing, by the computer, the clusters by moving individual components to clusters when such a move results in a lower incremental connectivity cost.

15. A computer implemented method as in claim 14 additionally comprising the step of:
(e) placing the clusters of components on an integrated circuit.

16. A computer implemented method as in claim 1 wherein the step (c) a criterion used in partitioning components is size of cluster.

17. A computer implemented method as in claim 1 wherein in step (c) a criterion used in partitioning components is a maximum number of external connections from each cluster.

18. A computer implemented method as in claim 1 wherein in step (c) a criterion used in partitioning components is a packaging cost.

* * * * *